(12) United States Patent
Ricking et al.

(10) Patent No.: US 7,205,170 B2
(45) Date of Patent: Apr. 17, 2007

(54) METHOD FOR THE PRODUCTION OF LED BODIES

(75) Inventors: Thorsten Ricking, Moers (DE); Cem Olkay, Witten (DE); Jörg Lehmann, Oberhausen (DE); Thomas Manth, Aachen (DE)

(73) Assignee: G.L.I. Global Light Industries GmbH, Kamp-Lintfort (DE)

( * ) Notice: Subject to any disclaimer, the term of this patent is extended or adjusted under 35 U.S.C. 154(b) by 342 days.

(21) Appl. No.: 10/497,727

(22) PCT Filed: Dec. 4, 2002

(86) PCT No.: PCT/DE02/04440

§ 371 (c)(1),
(2), (4) Date: Nov. 12, 2004

(87) PCT Pub. No.: WO03/054920

PCT Pub. Date: Jul. 3, 2003

(65) Prior Publication Data

US 2005/0059310 A1    Mar. 17, 2005

(30) Foreign Application Priority Data

Dec. 5, 2001    (DE) ............................... 101 59 522

(51) Int. Cl.
*H01L 21/00* (2006.01)
*H01L 21/56* (2006.01)
(52) U.S. Cl. .................. 438/27; 438/124; 438/126; 438/127; 257/E21.502; 264/272.17
(58) Field of Classification Search .......... None
See application file for complete search history.

(56) References Cited

U.S. PATENT DOCUMENTS

| 5,811,132 | A | * | 9/1998 | Rho et al. .................. 425/116 |
| 5,964,030 | A | | 10/1999 | Lee et al. |
| 5,998,243 | A | | 12/1999 | Odashima et al. |
| 2006/0051901 | A1 | * | 3/2006 | Manth ........................ 438/127 |

FOREIGN PATENT DOCUMENTS

| DE | 196 04 492 | 6/1997 |
| EP | 0 290 697 | 11/1988 |
| JP | 04 329680 | 11/1992 |
| JP | 06 21642 | 8/1994 |

OTHER PUBLICATIONS

International Search Report.

* cited by examiner

*Primary Examiner*—David E. Graybill

(57) ABSTRACT

The invention relates to a method for producing light-conducting LED bodies by injection molding into a mold of a material that is fusible prior to final solidification. Each LED body comprises at least one light-emitting chip and at least two wire-shaped electrodes that are electrically connected to the chip. The injection mold is evacuated via at least one opening per LED after positioning the electronic parts and closing. The evacuation opening is disposed in the proximity of the electrodes in the bottom area of the LED. The fusible material is injected between the bottom area and the chip or the reflector trough at least approximately parallel to the chip surface and at least approximately normal to a surface embodied by two electrodes, with the center line of the injection stream running between two electrodes. The inventive method for producing light-conducting LED bodies prevents the LED electronics from being damaged during normal performance of the injection molding process.

6 Claims, 1 Drawing Sheet

METHOD FOR THE PRODUCTION OF LED BODIES

Figure 4:
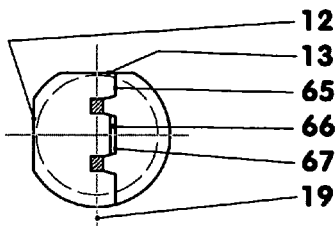

This application is a National Stage of International Application No. PCTIDE02/04440, filed Dec. 4, 2002, which claims the priority of German Patent Application Serial No. 101 59 522.0, filed Dec. 5, 2001.

Process for production of light-conducting LED elements from a material, flowable prior to final solidification, by injection into a mold, the individual LED elements including at least one light-emitting chip and at least two wire electrodes, electrically connected to the chip.

DE 196 04 492 discloses an injection molding tool for production of luminescent diodes. The luminescent diode to be produced is a radial LED having an at least locally cylindrical body. The injection molding nozzle is arranged in the mold at about mid-height of the cylindrical segment and oriented transverse to the longitudinal axis of the LED. Here, the injection molding nozzle is directed at least approximately at the center of gravity of the diode element to be injection molded. Around the injection molding nozzle there is a funnel-shaped passage for aspiration of the gas displaced from the mold in injection molding. Despite the interesting combination of the arrangement of the injection molding nozzle and the aspiration passage, this tool cannot prevent a very high reject rate, due among other things to the failure of the bonding wire.

The object of the present invention, then, is to develop a process for production of light-conducting LED elements in which the LED electronics are not damaged in the conventional operations of the injection molding process.

The problem so stated is solved by the features of the principal claim. To that end, the injection mold, after insertion of the electronic parts and closing, is evacuated by way of at least one opening per LED. Here, this evacuation opening is arranged in the bottom part of the LED in the vicinity of the electrodes. The flowable material is injected between the bottom portion and the chip, or reflector cup, at least approximately parallel to the plane of the chip and at least approximately normal to a plane formed by two electrodes. Thus, the centerline of the injection jet passes between two electrodes.

With this process of production by injection molding, a certain preassignment of the place of injection and the direction of injection in combination with an evacuation, performed at a defined location, of the injection mold, a flow-in condition is created that permits a controlled filling of the mold without any damage to the LED electronics. The result is an attenuation and subdivision of the high-energy injection jet, so that the injection mold, starting from the LED bottom region and extending as far as the LED tip, fills during an early fixation of the bonding wire by bilateral circumfluxion.

The process is applicable also to luminescent diodes having several chips and electrodes.

Other details of the invention will appear from the subsidiary claims and from the following description of an embodiment schematically represented by way of example.

Figure 1:
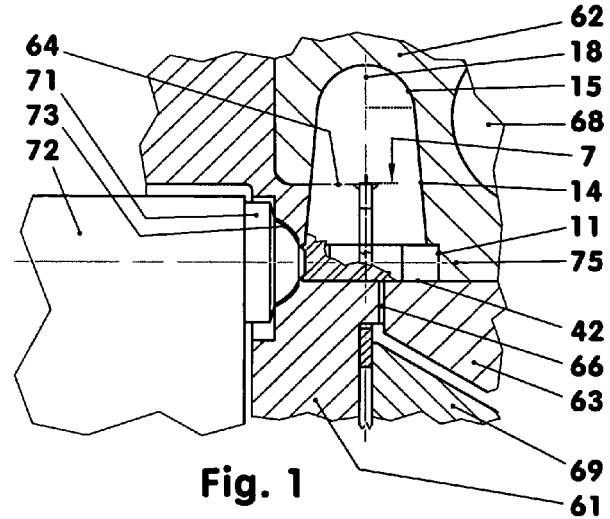
Figure 2:
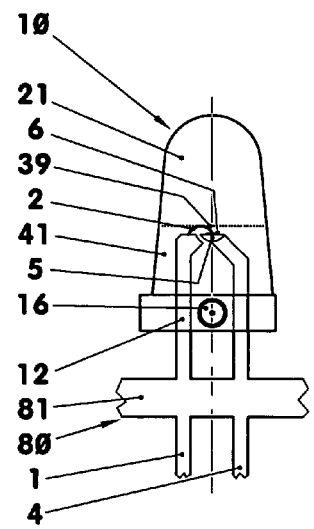
Figure 3:
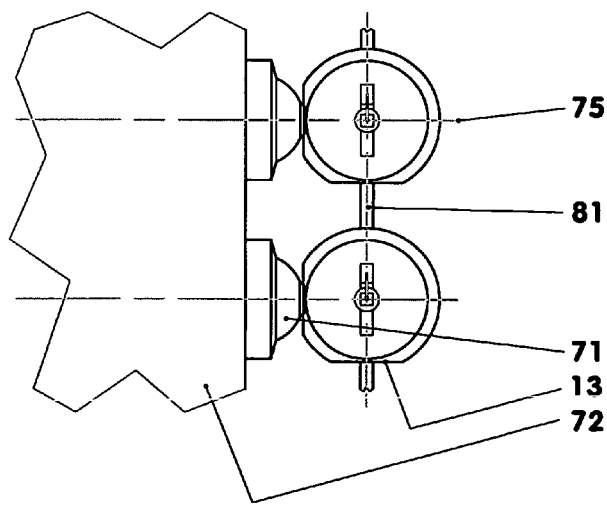

FIG. 1: side view of an injection molded LED in the mold;
FIG. 2: front view of the LED of FIG. 1;
FIG. 3: top view of an LED fabrication junction and injection nozzle;
FIG. 4: bottom view of the LED of FIG. 1, with parting line.

FIGS. 1 to 4 show an LED (10) whose light-conducting element (20) is produced by injection molding in one injection step.

The LED (10) shown in the figures here has an LED element (20) divided theoretically into two zones (21, 41), cf. FIG. 2. The bottom area (41) of the element (20) is a so-called electronic protection area, while the upper area (21) is referred to as a light-conduction area. The two zones are separated from each other by a fictive parting line (39). The parting line (39) is shown dotted in FIG. 2 only.

The electronic protection zone (41) as a rule surrounds the electrical connections (1, 4) located in a plane (19), the light-emitting chip (6), a bonding wire (2) and a reflector cup (5). The latter is for example part of the cathode (4). In the reflector cup (5), the chip (6) is seated. The chip (6) contacts the anode (1) by way of the bonding wire (2). The light-conduction zone (21) located above transports the light emitted by the chip (6) as loss-free as possible to the outer surface of the LED (10).

The material of the LED element (20) here is an injectable transparent, e.g. colored, thermoplastic, e.g. a modified polymethylmethacrylimide (PMMI).

The LED element (20) of this embodiment by way of example consists, respecting its spatial conformation, of three juxtaposed geometrical solids (11, 14, 15). The bottom geometrical solid (11) is at least approximately a straight cylinder having two at least approximately parallel faces and e.g. two plane flattenings (12, 13). The flattenings (12, 13) are parallel to the longitudinal axis (18) of the LED and enclose a right angle between them. One flattening (12) is parallel to the electrode plane (19) formed by the centerline of the electrodes (1, 4). The bottom face forms the so-called bottom portion (42). The upper face is adjoined by a straight truncated cone (14), tapering away from the cylinder (11). On the truncated cone (14), as third geometrical solid, is seated a spherical lune (15). In the longitudinal section of the LED, between the lune (15) and the truncated cone (14), there is a for example tangential transition.

The greater face diameter of the truncated cone (14) measures about 5 mm in this example. It is referred to as the base size. The taper of the truncated cone (14) is for example 20% of the base size. The total height of the LED (10) corresponds to about 180% of the base size. The height of the cylinder (11) which projects by about 10% of the base size beyond the truncated cone as a flange-like collar respecting its radius, measures about 30% of the base size. The depth of the flattenings (12, 13) is about 8% of the base size.

The portion of the truncated cone (14) and lune (15) located above the chip (6) forms the principal light exit surface.

For LED fabrication, the electrodes (1, 4) are part of a so-called electrode fence (80), usually punched out. Inside this fence, the electrodes (1, 4) are continuously connected to each other by webs (81). A fence (80) contains for example 32 electrodes for 16 LEDs (10). The minimum spacing of the LEDs (10) integrated side-by-side in the fence (80) is at least 10% of the maximum diameter, or maximum breadth, of the individual LED (10) in the electrode or fence plane (19). In this embodiment by way of example, the spacing of the centerlines (18) of two neighboring luminescent diodes (10) is about 150% of the base size.

For the injection molding of the LEDs (10), a multipartite mold (61–63) is employed, preassigning the shape of the luminescent diode (10) together with the injection nozzle (71). The largest part of the diode (10) to be fabricated is enclosed by a carriage mold (62). The latter forms for example a seamless principal light-exit surface and the part of the peripheral surfaces of the electronic protection zone (41) away from a neighboring base mold (61). The bottom portion (42) and the remaining peripheral surfaces of the LED (10) with the exception of an intake passage (66) and the injection nozzle attachment, are closed by the base mold (61) and a travel mold (63).

The base mold (61) is for example one of the main elements of the injection molding tool. It is here fixed to the stationary portion of the tool, and is not moved in unmolding. It comprises a recess (73) into which the injection nozzle (71) projects sealingly.

The travel mold (63) is arranged opposed to the base mold (61). The travel mold (63), in the representation of FIG. 1, is moved to the right from the base mold (61) for unmolding. With closed mold (61–63), the mold parts (61) and (63) meet at a parting line (65) represented in FIG. 4. The parting line (65) divides in the region between the electrodes (1, 4) to form an opening (67). The opening (67) is an edge of the suction passage (66) touching the bottom region (42), cf. FIG. 1. The suction passage (66) is offset from the electrode plane (19) by several tenths of a millimeter, away from the injection nozzle (71).

In the travel mold (63), a hold-down (69) is arranged. The hold-down (69) is mounted closably, e.g. in the direction of the opening travel. It clamps the electrode fence (80) against the base mold (61).

The plane formed by the mold parts (61, 63) that is adjoined by the projected bottom portion (42) of the LED (10) and the contour of the base mold (61) surrounding the injection nozzle (71) are adjoined by the carriage mold (62). Between the carriage mold (62) and the base mold (61), there is a spatially graduated parting line (64).

The carriage mold (62), which surrounds the greatest portion of the projected LED surface, is traversed by at least one tempering passage for tempering the mold and the surrounding other tool parts, e.g. by means of steam at for example 130° C. In FIG. 1, the carriage mold (62), merely by way of example, is shown made in one part. In the event that the diode molding part inside the carriage mold (62) is seated in a separate carriage support, the latter also may be outfitted with the tempering passage.

For preparation of the injection molding, the mold (61-63) is opened. For that purpose, the mold parts (63, 69) are lifted to the right. The carriage mold (62) is run obliquely upward to the right by means of a guide not shown, at an angle of for example 25° to the centerline (75) of the injection nozzle. The electrode fence (80), equipped with the chips (6) and the corresponding bonding wires (2), is inserted and centered on the base mold by index pins not shown. To close the mold (61–63), the travel mold (63) approaches the base mold (61). The hold-down (69) lodged in it runs on in closing direction until the electrode fence (80) is firmly clamped to the base mold (61). At the same time, for example, the carriage mold (62) travels towards the molds (61) and (63).

By way of the suction passage (66) and e.g. by way of the gap between the travel mold (63) and the hold-down (69), the cavity of the mold (61–63) to be injected with the flowable material is evacuated. The vacuum is maintained during the entire injection molding operation.

Immediately after the evacuation, the hot, flowable material is injected by way of the current injection nozzle (71), a so-called torpedo nozzle, into the corresponding cavity of the mold (61–63). The centerline (75) of the injection nozzle (71) and of the jet emerging from it is here oriented perpendicular to the electrode plane (19). It lies between the bottom region (42) and the lowest point of the reflector cup (5). In this embodiment by way of example, the centerline (75) is located at half-height of the cylinder (11). Thus, it runs halfway between the electrodes (1, 4), cf. FIG. 3.

During the injection molding operation, the liquid plastic at a pressure of 700±300 bars is shot into the evacuated, tempered mold (61–63). The jet passes the electrodes (1, 4) centrally and splits at the wall of the mold (62) opposed to the injection nozzle (71). Thus, the jet loses so much energy that the inflowing plastic, filling the cavity, cf. FIG. 1, in front of and behind the electrode plane (19), flows from below upward, and so cannot damage or break the sensitive electronics, in particular the bonding wire (2).

After complete filling of the mold, the pressure of the material may be sustained to make up for volume shrinkage in the mold. A good surface quality and a high precision of unmolding result.

After injection molding and unmolding, in an individuation step, the webs (81) between the luminescent diodes (10) and the electrodes (1, 4) of the several LEDs (10) are removed, for example by punching.

LIST OF REFERENCE NUMERALS 1 connection, anode, electrode
2 bonding wire, Al wire
4 connection, cathode, electrode
5 reflector cup
6 chip
7 chip plane
10 LED, luminescent diode, diode
11 cylinder, flange-like collar
12, 13 flattenings
14 truncated cone
15 lune
16 print of injection nozzle
18 LED centerlines, LED axes
19 electrode plane, plane of fence
20 LED element
21 light-conducting element
39 parting line, virtual, between (21) and (41)
41 electronic protection zone
42 bottom region
61 base mold
62 carriage mold
63 travel mold
64 parting line between (61) and (62)
65 parting line between (61) and (63)
66 suction passage
67 opening
68 tempering passage
69 hold-down
71 injection nozzles, torpedo nozzles, hot passage nozzles
72 heating cartridges
73 recess in (61)
75 centerlines of injection nozzles
80 electrode fence (lead frame strips)
81 webs, upper

The invention claimed is:

1. Process for production of light-conducting LED elements from a material, flowable prior to final solidification, by injection into a mold, the individual LED element including at least one light-emitting chip and at least two wire electrodes electrically connected to the chip, and a bottom region comprising the steps of:

providing a mold adapted for insertion of at least one individual LED element with two electrodes, which upon mold closing includes at least one opening providing for evacuation; wherein the mold, after insertion of the individual LED and closing, is evacuated by way of said at least one opening, said opening being arranged in a bottom region of the LED in a place between electrodes; and injecting a jet of a flowable material into the mold between the bottom region and the chip at least approximately parallel to the chip plane and at least approximately perpendicular to a plane formed by the two electrodes, wherein a centerline of the jet passes between two electrodes.

2. Process of production according to claim 1, wherein the vacuum in the mold and the neighboring tool areas is maintained during the entire injection molding operation.

3. Process of production according to claim 1, wherein the centerline of the jet passes in the geometrical center between two electrodes.

4. Process of production according to claim 1, wherein the centerline of the jet intersects the centerline of the LED element.

5. Process of production according to claim 1, wherein said LED has a flange-like collar, and the centerline of the jet runs at half-height of the collar.

6. Process of production according to claim 1, wherein the vacuum is produced by way of a suction passage whose opening is located between the electrodes.

* * * * *